United States Patent [19]

Hasaka

[11] Patent Number: 5,185,285
[45] Date of Patent: Feb. 9, 1993

[54] METHOD OF PRODUCING POLYCRYSTALLINE SILICON RESISTOR

[75] Inventor: Takashi Hasaka, Tokyo, Japan

[73] Assignee: Seiko Instruments, Inc., Tokyo, Japan

[21] Appl. No.: 731,170

[22] Filed: May 30, 1991

[30] Foreign Application Priority Data

May 30, 1990 [JP] Japan .................. 2-143027

[51] Int. Cl.⁵ ............................. H01L 21/70
[52] U.S. Cl. ....................... 437/60; 437/918; 437/46; 437/47; 148/DIG. 136
[58] Field of Search ............. 437/918, 60, 46, 47; 148/DIG. 136

[56] References Cited

U.S. PATENT DOCUMENTS 4,604,789 8/1986 Bourassa ..................... 437/60
4,643,777 2/1987 Maeda ........................ 437/918

Primary Examiner—Brian E. Hearn
Assistant Examiner—Trung Dang
Attorney, Agent, or Firm—Spensley, Horn, Jubas & Lubitz

[57] ABSTRACT

A metal film and a polysilicon film are formed in one wiring, in that after a first polysilicon film is formed, an insulating film is formed on a region where a high-resistance portion of the polysilicon film is to be formed and, then, a metal film is deposited thereon. Then, the metal film deposited on the insulating film is removed. Thereafter, the wiring is formed by photolithography.

1 Claim, 3 Drawing Sheets

DOPING OF IMPURITIES

DOPING OF IMPURITIES

A SILICIDE FILM

METHOD OF PRODUCING POLYCRYSTALLINE SILICON RESISTOR

BACKGROUND OF THE INVENTION

The present invention relates to a method of producing polycrystalline silicon film resistors used as components in semiconductor devices.

A polycrystalline silicon, or polysilicon, film is commonly used as a resistor in semiconductor devices. To meet current demands for higher operating speed and greater degree of integration of semiconductor devices, furthermore, a polycide film having a double-layer structure consisting of a polysilicon film and a silicide film are now being used as a gate and a resistor, instead of a polysilicon film. The polysilicon film used as wiring has a resistivity whose smallest value is $1 \times 10^{-3}$ Ωcm and the polycide film has a smaller resistivity of $1 \times 10^{-4}$ Ωcm.

When used as a resistor, however, such film must have a resistivity greater than the above values. For instance, a resistor used for SRAMs must have a resistance of 1 megohm to 1 gigaohm. A resistivity greater than $1 \times 10^{-3}$ Ωcm is in many cases required even for other devices. When a high resistance is required, in particular, the polycide film that is used as the resistor is given a decreased width (W) and an increased length (L). For instance, when a resistor of 10 kΩ is to be obtained using a polycide film with a resistivity of $1 \times 10^{-4}$ Ωcm, the resistor is given a length L=4000 μ(4 mm) if W=4 μ and its thickness t=0.1 μ, which represents a very long section of wiring occupying a large area, resulting in an increase in the chip area.

In the case of polysilicon films, the resistivity changes depending upon the amount of doping; this makes it possible to form a high-resistance portion and a low-resistance portion in a single wiring. When a polysilicon resistor is used, therefore, only one polysilicon film suffices, and those film portions other than the resistor can be used as wiring portions and gate electrodes.

Such a structure is shown in FIG. 3 and includes a semiconductor substrate 21, an insulating film 22 on substrate 21 and a polysilicon film 23 formed on insulating film 22. High-resistance portions and low-resistance portions are formed in the same polysilicon film 23 without creating any problem in the connections between high-resistance portions and low-resistance portions.

When a polycide film is used, however, it is not permissible to arbitrarily control the resistivity of the polycide film; i.e., it is not permissible to form the low-resistance portions and the high-resistance portions simultaneously in one wiring. Therefore, a method has been employed to form the wiring in two layers as shown in FIG. 4 which illustrates an exemplary portion of an IC having a field-effect transistor formed in a semiconductor substrate 31 at a location where the surface of substrate 31 is exposed by an opening in an insulating film 32. The transistor is composed of a gate insulating film 33 and source and drain regions 35 and 36. Low resistance wiring portions, including the transistor gate electrode, are provided by polycide wiring 34 and wiring that must provide high resistance portions is composed of a polycrystalline silicon film 36. Reference numeral 37 denotes an aluminum film.

Thus, semiconductor devices having resistors employ a double-layer wiring consisting of a polycide wiring and a polycrystalline silicon film resistor, and their fabrication requires a large number of steps and a large number of lithography operations, with attendant high manufacturing cost. When polycide films are used, the double layer may have to be used though only one layer would have been needed if polysilicon film alone were used. Therefore, the number of steps increases to a considerable degree and, at the same time, mask alignment is needed, making it difficult to form fine patterns.

Moreover, the polysilicon films and the polycide films must be formed so as to reliably contact each other, and attention must be given to forming the contacts. Moreover, double-layer wiring makes the semiconductor device more rugged, and a special planarization is necessary to prevent breakage or short-circuits in the wiring.

SUMMARY OF THE INVENTION

It is a primary object of the present invention to eliminate, or at least alleviate, the above-mentioned problems.

The above and other objects are achieved, according to the present invention, by a method of producing semiconductor device element including a polycrystalline silicon film resistor, comprising the steps of: forming a polycrystalline silicon film; doping a selected region of the polycrystalline silicon film with impurities in an amount to cause the selected region to have a high electrical resistivity; covering the selected region with an insulating film; doping parts of the polycrystalline silicon film which are not covered by the insulating film with impurities selected to cause those film parts to have an electrical resistivity which is substantially lower than that of the selected region; forming a metal film on the polysilicon film after the doping steps; selectively removing parts of the metal film from above the selected region of the polycrystalline silicon; and selectively removing parts of the polycrystalline silicon film to form a wiring pattern.

DESCRIPTION OF THE PREFERRED EMBODIMENTS

A preferred embodiment of the present invention will now be described with reference to FIGS. 1.

Figure 1A:
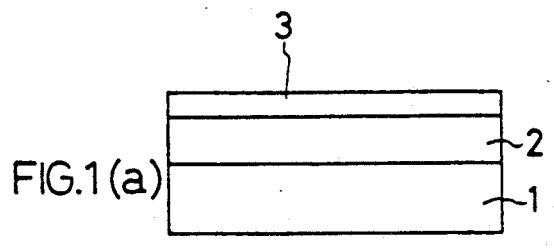
FIGS. 1(a) to 1(i) are cross-sectional views illustrating successive steps of a method of producing a semiconductor device according to the present invention.

In FIG. 1(a), an insulating film 2 is formed on a semiconductor substrate 1, and a polycrystalline silicon film 3 is deposited on insulating film 2. The constituent elements according to the present invention are related to the polycrystalline silicon film 3 and the subsequently formed components, and the structure up to this point may take various forms. For instance, the present invention may be carried out after a transistor is formed. The polycrystalline silicon, or polysilicon, film 3 shown in FIG. 1(a) is generally an undoped film. However, the polysilicon film 3 may contain impurity in such a concentration that it has a high resistance.

Figure 1B:
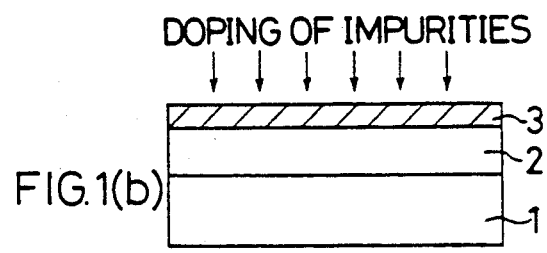

Next, as shown in FIG. 1(b), the device is doped with impurity to form a high-resistance region or regions in film 3. The impurity is usually phosphorus (P), arsenic (As) or boron (B), but may be some other element or impurity. Further, the doping is not needed if a high-resistance portion can be formed otherwise. The desired results can be achieved even when the impurity is doped into the whole surface of the wafer. The doping, however, may be effected only into the region where a high-resistance portion is to be created. The doping can be carried out by ion implantation or diffusion.

Figure 1C:
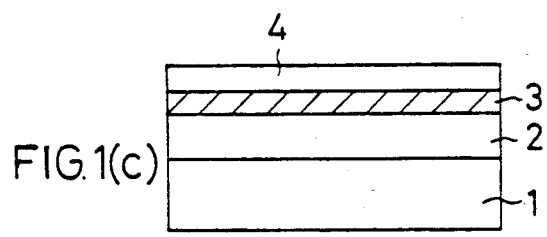

Next, an insulating film 4 is formed as shown in FIG. 1(c). The insulating film 4 may be a silicon oxide film ($SiO_2$ film), a silicon nitride film (SiN film) or a silicon oxynitride film (SiON film). Insulating film 4 serves as a stopper in the subsequent doping with impurities.

Figure 1D:
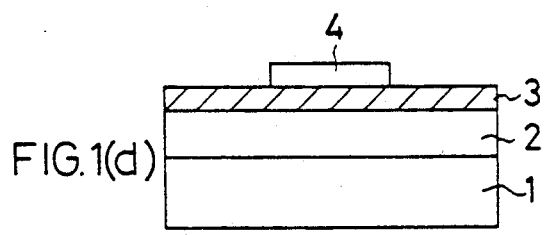

Next, as shown in FIG. 1(d), the insulating film 4 is left only on the region or regions that form high-resistance portions but is removed from all other regions, so that selected parts of polysilicon film 3 are exposed.

Figure 1E:
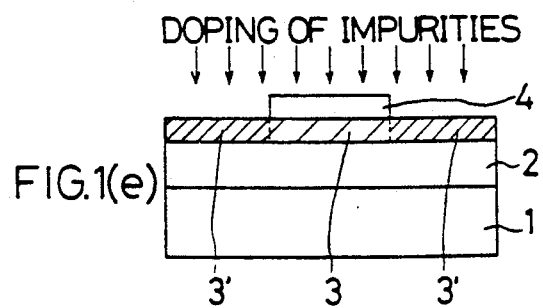

Next, as shown in FIG. 1(e), the exposed portions of polysilicon film 3 are doped with impurity to a high concentration in order to form a low-resistance polysilicon portion or portions 3'. The doping is carried out by either ion implantation or diffusion. The dopant may be phosphorus (P), arsenic (As), antimony (Sb) or boron (B). In the case of the polycide film, the silicide film mostly contributes to a flow of electric current. In the step of doping at a high concentration, therefore, the amount of impurity may be smaller than that for forming the wiring parts of the polysilicon film alone. When a polycide film structure is used as a gate electrode, a minimum limit in the amount of impurity in the step of FIG. 1(e) is determined to be that at which the characteristics of the transistors just become stabilized. Such a polycide film structure may be formed at the interface between regions 3' and a subsequently applied metal film (5 in FIGS. 1(f)-(i)). When the polycide film is used as a wiring layer, furthermore, the impurity concentration of the polysilicon film need not be significantly increased; i.e., no problem arises even with an impurity doping level selected for high resistance carried out in the step of FIG. 1(b). Therefore, the step of doping at a high concentration can be eliminated. In either case, the doping depends on the device that is used. Even when the polycide film is used as a gate electrode, the step of FIG. 1(e) can be eliminated provided the polysilicon film 3 corresponding to the high-resistance portion can be formed with a minimum amount of doping at which the characteristics of the transistors become stabilized.

Figure 1F:
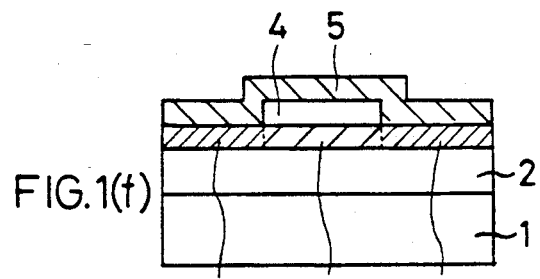

Then a metal film 5 is formed as shown in FIG. 1(f). The metal film 5 may be composed of tungsten (W), titanium (Ti), molybdenum (Mo), platinum (Pt), cobalt (Co), palladium (Pd), gold (Au), copper (Cu), silver (Ag), or like materials. Metal film 5 is formed by the chemical vapor deposition (CVD) method or the physical vapor-phase deposition (PVD) method. After metal film 5 is formed, a heat treatment may be effected to form a silicide film at the interface between film 5 and portions 3 or the heat treatment need not be effected. Even after the heat treatment is effected, the metal film 5 that exists on the insulating film 4 does not become a silicide film. That is, only the metal film 5 in contact with the polycrystalline silicon film 3 partly or wholly becomes a silicide film upon the treatment with heat.

Figure 1G:
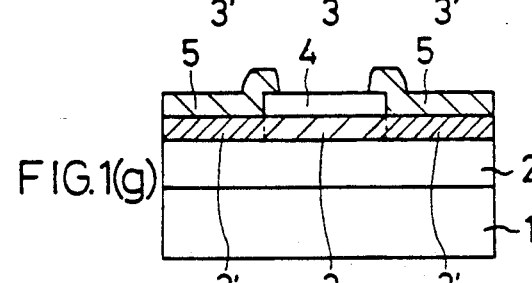

Referring next to FIG. 1(g), the metal film 5 is selectively removed by etching from above the high-resistance portion. The metal film is removed by either dry etching or wet etching. The insulating film 4 serves as a stopper for the etching.

Figure 1H:
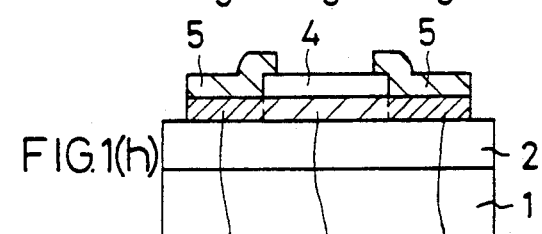

Then, a wiring layer is, formed by selective removal of parts of films 3 and 5 as shown in FIG. 1(h). At this moment, the high-resistance portions and the low-resistance portions are separately patterned to independently form the wirings. However, in order to decrease the patterning steps, in general, the wirings for the high-resistance portion and low-resistance portion are formed simultaneously during one patterning procedure. Therefore, the three kinds of structures, i.e., metal film/polysilicon film, metal film/insulating film/polysilicon film, and insulating film/polysilicon film, are subjected to the etching simultaneously. Furthermore, if the insulating film 4 has been selectively removed by etching from the region where the metal film had been removed prior to the step of etching, the three kinds of structure which are subjected to the etching are metal film/polysilicon film, metal film/insulating film/polysilicon film, and polysilicon film. In general, it is most difficult to etch the insulating film. Therefore, the insulating film 4 should preferably have a reduced thickness provided the insulating film has a minimum thickness that prevents the polysilicon film having high resistance from being doped with impurities in the step of FIG. 1(e) involving doping impurities at a high concentration, and provided the insulating film has a minimum thickness that serves as a stopper in the FIG. 1(f) step of etching the metal film.

Figure 1I:
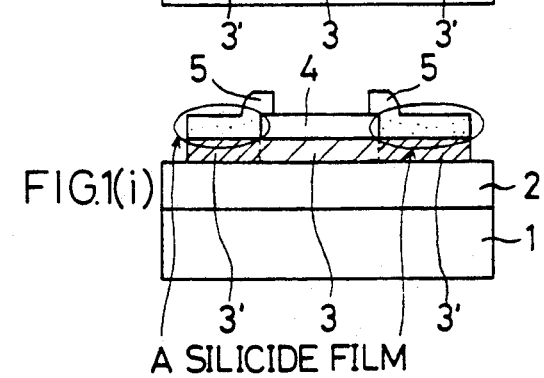

Next, when the heat treatment is effected as shown in FIG. 1(i), the metal film 5 that is in contact with the polysilicon film partly or wholly becomes a silicide film. This heat treatment may of course be carried out in common with the heat treatment carried out in the subsequent steps.

Figure 2A:
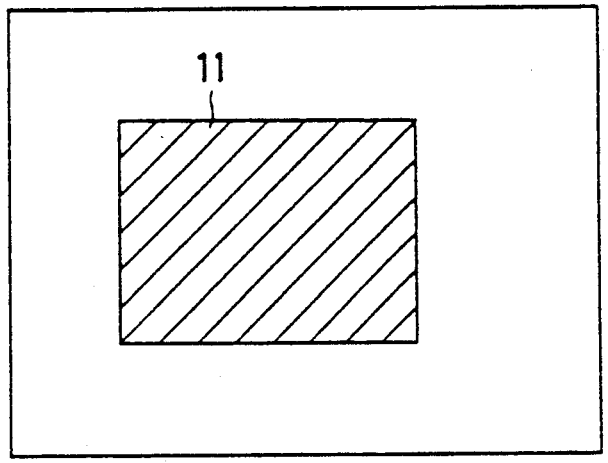
FIGS. 2(a) to 2(c) are plan views further illustrating certain of the steps of the method illustrated in FIGS. 1 for producing a semiconductor device according to the present invention
Figure 2B:
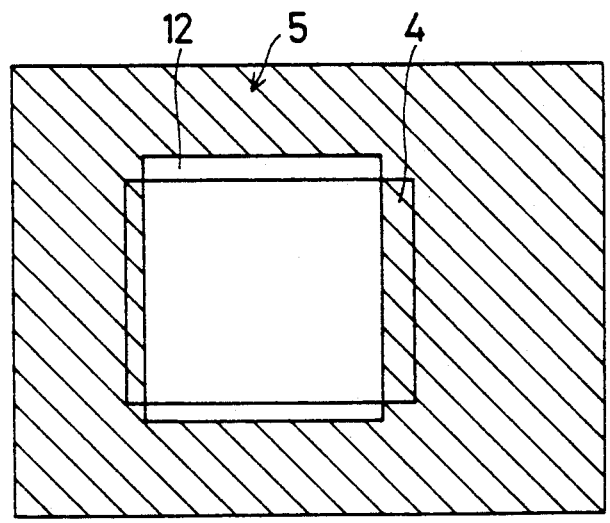
Figure 2C:
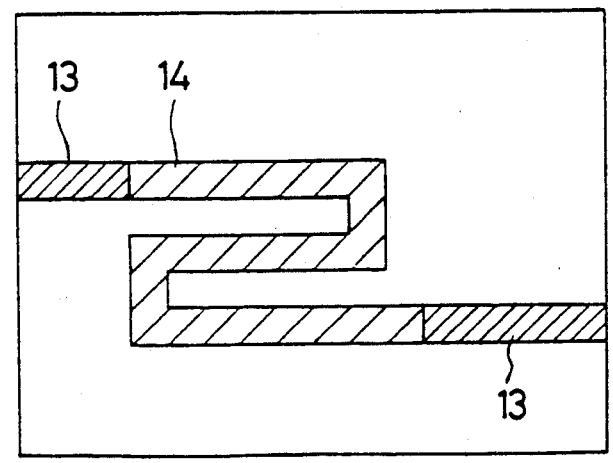
Figure 3:
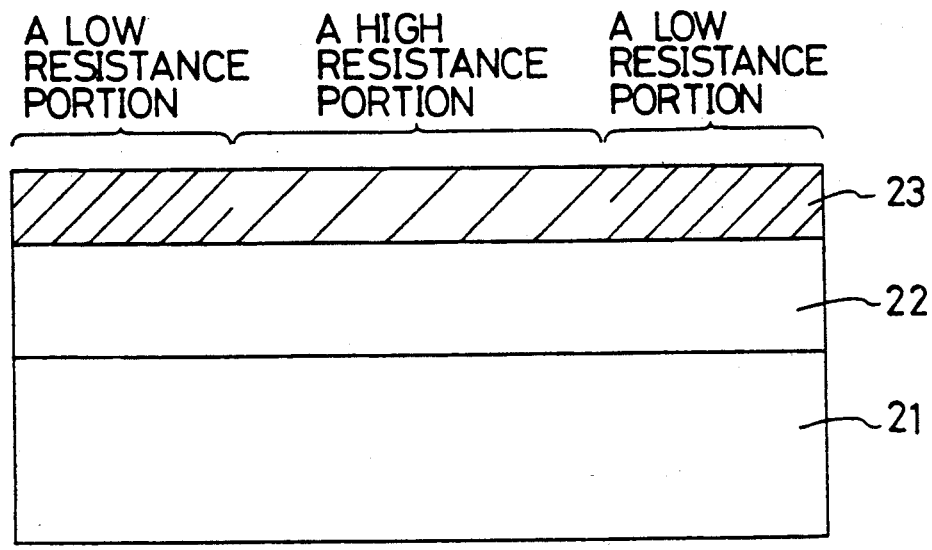
FIG. 3 is a cross-sectional view of a polysilicon wiring having conventional high-resistance portions and low-resistance wiring.
Figure 4:
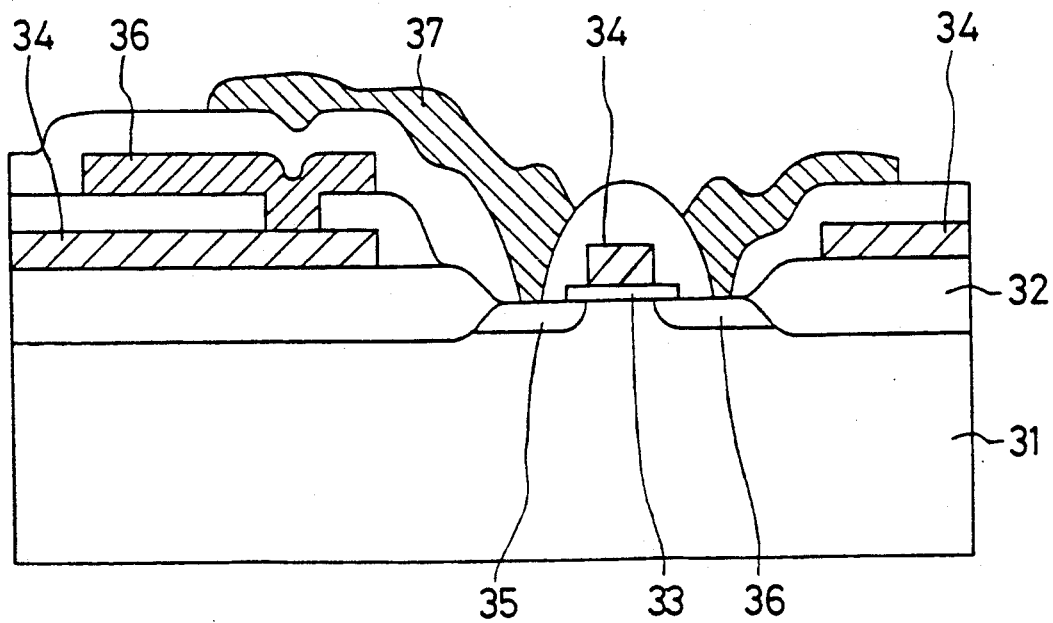
FIG. 4 is a cross-sectional view of a semiconductor device with a two-layer wiring of conventional metal film/polysilicon film layer and high resistance polysilicon film layer.

Next, the embodiment of the present invention will be described with reference to the plan view of FIG. 2. FIG. 2(a) shows a region 11 of the insulating film 4 described with reference to FIG. 1(d) and FIG. 2(b) shows a region 12 for etching the metal film that corresponds to FIG. 1(g). What is important here is that the region for etching the metal film of FIG. 2(b) must be so determined that the wiring of the high-resistance portion is not rendered conductive by the metal film when the wiring of the high-resistance portion is subjected to etching. FIG. 2(c) corresponds to FIG. 1(h) or FIG. 1(i). As shown in FIG. 2(c), the metal film/polysilicon film wiring 14 forms a continuous structure with the wiring 13 constituting polysilicon resistors.

A thus formed resistor of polysilicon film is continuous to the metal film/polysilicon film wiring and features a high precision.

Here, the step of removing the metal film of FIG. 1(g) may be effected after the step of FIG. 1(h).

A metal film as a wiring layer and a polysilicon film as a high-resistance resistor are formed as a single layer through a reduced number of steps and are used as a continuous wiring, thereby eliminating contact problems. Therefore, a semiconductor device is formed having a resistor with favorable characteristics.

According to the present invention as described above, the metal film/polysilicon film and the high-resistance polysilicon wiring are formed as a single continuous wiring. Therefore, the high-resistance polysilicon wiring and the metal film/polysilicon film wiring are formed as a single-layer structure without the need of employing the conventional double-layer wiring structure. Moreover, even fine wiring patterns are formed making it possible to form polysilicon resistors while maintaining high precision. Furthermore, use of the metal film helps decrease the wiring resistance.

This application relates to subject matter disclosed in Japanese Application JP 2-143027, filed on May 30, 1990, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. A method of producing semiconductor device element including a polycrystalline silicon film resistor, comprising the steps of:

forming a first insulating film on a semiconductor substrate;

forming a polycrystalline silicon film on the first insulating film, the polycrystalline silicon film having a selected region containing a resistor-forming part and a conductor lead-forming part contiguous with the resistor-forming part;

doping the selected region of the polycrystalline silicon film with impurities in an amount to cause the selected region to have a high electrical resistivity;

covering the doped selected region with a second insulating film;

pattern in the second insulating film by removing a part of the second insulating film which covers the conductor lead-forming part;

heavily doping parts of the selected region of the polycrystalline silicon film which are not covered by the patterned second insulating film with impurities selected to cause those film parts to have an electrical resistively which is substantially lower than that of the part of the selected region which is covered with the patterned second insulating film;

forming a metal film on the heavily doped polycrystalline silicon polysilicon film parts and on the patterned second insulating film;

selectively removing a part of the metal film from above a part of the patterned second insulating film; and selectively patterning parts of the polycrystalline silicon film, the metal film and the second insulating film.

* * * * *